(12) United States Patent
Kilpelä et al.

(10) Patent No.: US 7,476,618 B2
(45) Date of Patent: Jan. 13, 2009

(54) SELECTIVE FORMATION OF METAL LAYERS IN AN INTEGRATED CIRCUIT

(75) Inventors: Olli V. Kilpelä, Helsinki (FI); Wonyong Koh, Hachioji (JP); Hannu A. Huotari, Espoo (FI); Marko Tuominen, Helsinki (FI); Miika Leinikka, Vantaa (FI)

(73) Assignee: ASM Japan K.K., Tokyo (JP)

( * ) Notice: Subject to any disclaimer, the term of this patent is extended or adjusted under 35 U.S.C. 154(b) by 250 days.

(21) Appl. No.: 11/254,071

(22) Filed: Oct. 18, 2005

(65) Prior Publication Data

US 2006/0121733 A1 Jun. 8, 2006

Related U.S. Application Data

(60) Provisional application No. 60/622,141, filed on Oct. 26, 2004, provisional application No. 60/662,144, filed on Mar. 15, 2005.

(51) Int. Cl.
*H01L 21/44* (2006.01)

(52) U.S. Cl. .................. 438/686; 438/642; 438/650; 438/687; 438/694; 438/695; 438/758; 438/768

(58) Field of Classification Search ................ 438/584, 438/597, 598, 618, 622, 623, 627, 650, 686; 257/E21.597, E21.006, E21.17, E23.162
See application file for complete search history.

(56) References Cited

U.S. PATENT DOCUMENTS

| | | | | |
|---|---|---|---|---|
| 5,695,810 A * | 12/1997 | Dubin et al. | ................ | 438/643 |
| 6,015,986 A | 1/2000 | Schuegraf | | |
| 6,139,700 A * | 10/2000 | Kang et al. | ............ | 204/192.17 |
| 6,335,280 B1 | 1/2002 | Van der Jeugd | | |
| 6,391,785 B1 | 5/2002 | Satta et al. | | |
| 6,455,424 B1 | 9/2002 | McTeer et al. | | |
| 6,482,740 B2 * | 11/2002 | Soininen et al. | ............. | 438/686 |
| 6,664,192 B2 | 12/2003 | Satta et al. | | |
| 6,852,635 B2 | 2/2005 | Satta et al. | | |
| 7,404,985 B2 * | 7/2008 | Chang et al. | ............. | 427/248.1 |
| 2003/0165615 A1 * | 9/2003 | Aaltonen et al. | ............. | 427/79 |
| 2004/0005753 A1 | 1/2004 | Kostamo et al. | | |
| 2004/0192021 A1 * | 9/2004 | Li | .............................. | 438/622 |

(Continued)

OTHER PUBLICATIONS

T. Aaltonen et al. "Reaction Mechanism Studies on Atomic layer Deposition of Ruthenium and Platinum," Electrochem. Solid-State Lett., 6 (2003), C130-133.*

(Continued)

*Primary Examiner*—Ha Tran T Nguyen
*Assistant Examiner*—Daniel Whalen
(74) *Attorney, Agent, or Firm*—Knobbe, Martens, Olson & Bear LLP

(57) ABSTRACT

A method for enhancing the reliability of copper interconnects and/or contacts, such as the bottom of vias exposing top surfaces of buried copper, or at the top of copper lines just after CMP. The method comprises contacting the exposed copper surface with a vapor phase compound of a noble metal and selectively forming a layer of the noble metal on the exposed copper surface, either by a copper replacement reaction or selective deposition (e.g., ALD or CVD) of the noble metal.

45 Claims, 8 Drawing Sheets

U.S. PATENT DOCUMENTS

| | | | |
|---|---|---|---|
| 2004/0192036 A1* | 9/2004 | Koyanagi et al. | 438/680 |
| 2005/0085031 A1* | 4/2005 | Lopatin et al. | 438/222 |
| 2005/0124154 A1 | 6/2005 | Park et al. | |
| 2006/0177601 A1 | 8/2006 | Park et al. | |
| 2007/0026654 A1* | 2/2007 | Huotari et al. | 438/585 |
| 2007/0190782 A1 | 8/2007 | Park | |

OTHER PUBLICATIONS

T. Aaltonen et al. "Atomic Layer Deposition of Ruthenium Thin Films from Ru(thd)3 and Oxygen," Chem. Vap. Deposition, 10, pp. 215-219.*

Lee et al., "Electroless CoWP boosts cooper reliability, device performance," Semiconductor International, Jul. 1, 2004, 5 pages.

* cited by examiner

SELECTIVE FORMATION OF METAL LAYERS IN AN INTEGRATED CIRCUIT

This application claims the priority benefit under 35 U.S.C. § 119(e): U.S. patent application Ser. No. 60/622,141 to Kilpera, filed Oct. 26, 2004; and U.S. patent application Ser. No. 60/662,144 to Huotari et al., filed Mar. 15, 2005.

BACKGROUND OF THE INVENTION

1. Field of the Invention

The present invention generally relates to a method of selectively forming metal layers, more specifically to a method of selectively forming noble metal layers.

2. Description of the Related Art

A back-end-of-line (BEOL) copper interconnect is formed by a damascene or dual damascene process. A damascene process involves creating interconnect lines by first etching trenches or vias in a planar dielectric layer and then filling the trench or vias with a metal, typically copper. In a dual damascene process, which is a conventional semiconductor metallization process, another level is involved, where a series of holes (i.e. contact holes or vias) are etched and filled simultaneously with the trenches. After filling the trenches and/or vias with a metal, the metal and dielectric are planarized by chemical mechanical polishing (CMP), leaving the metal isolated in the trenches and/or vias. A diffusion barrier layer is typically formed before metal deposition in order to prevent diffusion of metal atoms into the dielectric layer.

A dielectric capping layer over copper (Cu), commonly chemical vapor deposition (CVD) SiN, is often used in interconnect metallization schemes. The copper capping layer is usually deposited after a CMP step, which is accomplished after electrochemical deposition of a Cu blanket film and leaves upper surfaces of Cu lines exposed. If no capping layer is used on top of the Cu lines, they would be in intimate contract with the next interlevel dielectric (ILD). This would lead to two primary modes of reliability failure. The first one is leakage current between adjacent Cu lines as Cu atoms would freely diffuse into the ILD, thus degrading the ILD between the Cu lines. The second one is electromigration (EM) related early failure, as Cu atoms would migrate along the poor quality interface between Cu and a dielectric and voids could be formed in the Cu line when electrical current passes through the Cu line. Even with a conventional Cu capping layer, interface-related diffusion (migration of Cu atoms along the interface between, e.g., a Cu line and a Cu capping layer) is one of the leading mechanisms of Cu interconnect failure.

Additional disadvantage of separate blanket CVD dielectric capping layers is an increase of effective k-value for interlevel dielectrics. CVD SiN layer has higher k-value than ILD. Even low-k capping materials such as SiCN and SiC has still higher k-value than the low-k ILD. Thus, the effective k-value of the interlevel dielectric (ILD) increases by addition of the cap layer, relative to the low-k materials that are used as the main dielectric material.

Additionally, adhesion of copper at the via bottom is critical to interconnect reliability because interconnect failure frequently occurs at a via due to migration of copper atoms due to electrical current (EM) or mechanical stress during thermal cycle (stress-induced voiding or SIV). Dielectric layers can exhibit higher thermal expansion than metal, such that the metal in a via is under compressive stress at elevated temperature and under tensile stress at lowered temperature during thermal cycles. Preventing surface or interface migration of copper, which is related to adhesion strength, is important to enhancing copper interconnect reliability. This is especially true for thinner diffusion barriers formed by atomic layer deposition (ALD). In general, an ALD or CVD layer shows weaker adhesion than a PVD layer. On the other hand, an ALD copper diffusion barrier layer is desirable because the thinner barrier layer allows more space for copper in the same via or trench volume and increases conductivity compared to thicker PVD barriers.

One approach to alleviating the abovementioned problems is by selectively forming a copper capping (reliability enhancing) layer over the copper interconnect and/or via forming. A recent innovation in the field selectively deposits CoWP on the top of Cu lines with a CoWP compound by an electroless plating method (e.g., Valery M. Dubin et al., U.S. Pat. No. 5,695,810 "Use of cobalt tungsten phosphide as a barrier material for copper metallization"; Bill Lee, "Electroless CoWP Boosts Copper Reliability, Device Performance" Semiconductor International Jul. 1, 2004, This has been proven to significantly improve interconnect reliability. However, this method has disadvantages, such as many process steps and severe process control and cost issues.

Thus there is a need for a productive, controllable method for forming reliable interfaces in integrated circuit (IC) metallization.

SUMMARY OF THE INVENTION

According to one aspect of the invention, a method is provided for forming a conductive layer in an integrated circuit (IC). The method comprises providing a first surface comprising copper (Cu) and a second surface. The first surface and the second surface are contacted with a vapor phase compound of a noble metal, thereby selectively forming a conductive layer comprising the noble metal on the first surface relative to the second surface. In an illustrated embodiment, the noble metal is selectively formed on metal surfaces relative to surrounding insulators.

According to another aspect of the invention, a method is provided for selectively forming a conductive layer in an integrated circuit. The method comprises providing a first surface and a second surface, the first surface being defined by a metal feature of the integrated circuit, the metal feature comprising copper. The first surface and the second surface are contacted with a vapor phase compound of a noble metal. A replacement reaction is performed, wherein the copper of the metal feature is replaced with the noble metal atoms dissociated from the vapor phase compound of the noble metal, thereby selectively depositing the conductive layer, comprising the noble metal, on the first surface relative to the second surface.

According to yet another aspect of the invention, a method is provided for enhancing reliability of a copper interconnect. The method comprises providing a copper surface and a dielectric surface. The copper and dielectric surfaces are contacted with a vapor phase compound of a noble metal. A reliability enhancing layer of noble metal is formed on the copper surface selectively relative to the dielectric surface by supplying a vapor phase compound of the noble metal. In one embodiment, the copper surface is exposed at the bottom of vias. In another embodiment, the copper surface is the upper surface of an inlaid copper line and the dielectric surface coplanar with the copper surface.

According to yet another aspect of the invention, a metallization structure in an integrated circuit is provided. The structure comprises a metal feature recessed within an insulator. A noble metal layer covers a surface of the metal feature, wherein the noble metal layer is at least partially recessed within the insulator.

According to yet another aspect of the invention, an interconnect circuit is provided. The integrated circuit comprises a copper feature recessed within an insulator. A noble metal layer selectively covers a surface of the copper feature.

DETAILED DESCRIPTION OF THE PREFERRED EMBODIMENT

Reliability enhancing material can be selectively formed only on exposed interconnect (e.g, copper) surfaces at, for example, a via bottom and/or the exposed upper surface of a copper interconnect, forming metal capping layers. One method is by exploiting faster nucleation on a metal surface relative to an insulating surface, thereby depositing noble metal atoms (e.g., by selective CVD or ALD) on the metal surface. Another method is by replacing copper atoms on an exposed copper layer with noble metal atoms using a replacement reaction. Additional noble metal atoms may be deposited (e.g., by selective CVD or ALD) on the Cu-replacing noble metal layer to increase the thickness of a reliability-enhancing layer. Advantageously, the methods of illustrated embodiments employ vapor phase reactants.

After patterning and etching, the surface of a damascene or dual damascene structure comprises mainly dielectric materials: low-k material, dielectric barrier layer and additional material, such as an etch stopping layer. Before barrier deposition and copper filling, the only metallic surface on the wafer surface exists at the via bottom as copper metal or its slightly oxidized form, depending on the etch and storage conditions.

Reference will now be made to the figures, wherein like numerals refer to like parts throughout. It will be appreciated that the Figures are not necessarily drawn to scale.

In the following embodiments, any element used in an embodiment can interchangeably be used in another embodiment, and any combination of elements can be applied in these embodiments.

During formation of a reliability enhancing layer, a conductive layer, preferably a conductive layer comprising a noble metal, is selectively formed on a first surface relative to a second surface. In some illustrated embodiments (FIGS. 3-5), the first surface is the upper surface of a portion of a buried copper (Cu) line exposed at the bottom of a via and the second surface is defined by a dielectric material defining the via as well as upper field regions. The first surface is recessed relative to the second surface. In other illustrated embodiments (FIGS. 6-8), the first surface is the exposed upper surface of a Cu line in a trench just after chemical mechanical polishing (CMP) and the second surface is the upper surface of an interlayer dielectric (ILD) layer, or of a CMP stop layer. For purposes of the present description, any dielectric CMP stop layer in the dual damascene structure is considered part of the ILD layer. The first surface and the second surface are substantially coplanar in these cases.

Figure 1:
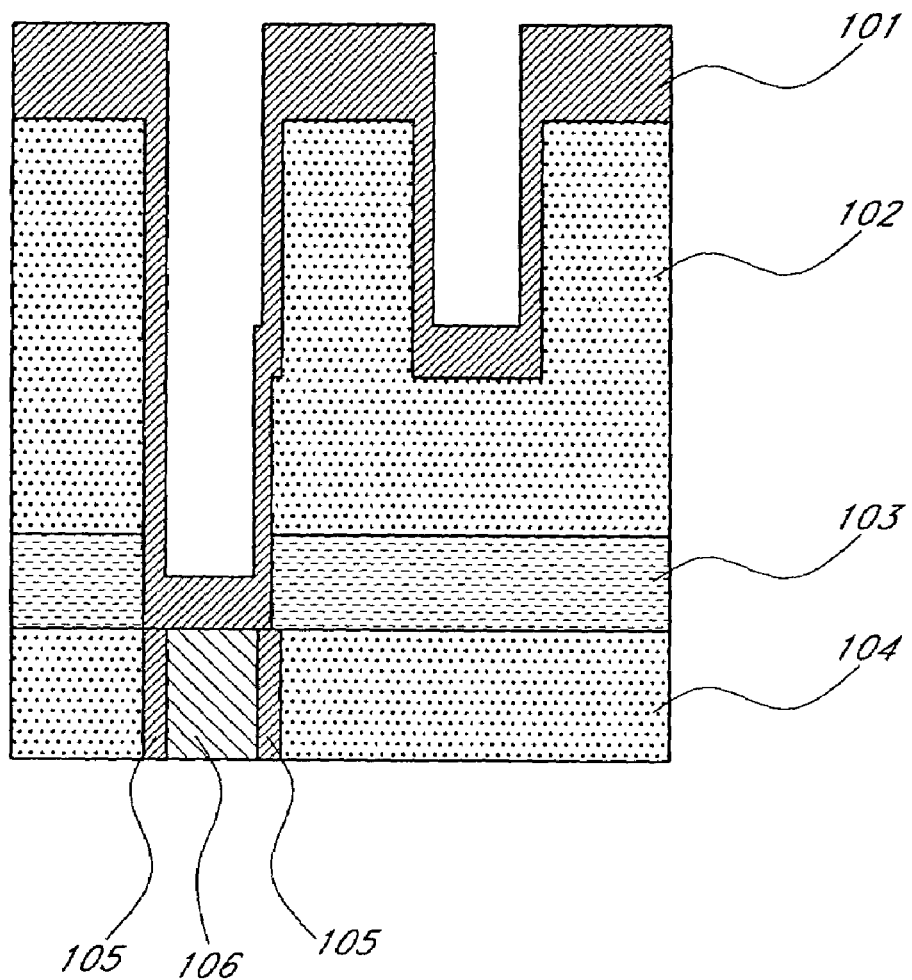
FIG. 1 is a schematic view of a dual damascene structure after depositing a diffusion barrier layer by sputtering, in accordance with the prior art.

With reference to FIG. 1, a typical process sequence of forming one level of interconnect layer in a dual damascene structure comprises: (i) chemical mechanical polishing (CMP) of a preexisting metal structure 106, a diffusion barrier 105 and a lower ILD layer 104 at a lower level to get a flat surface; (ii) depositing a dielectric diffusion barrier layer 103; (iii) depositing a dielectric layer 102, preferably of lower k-value than $SiO_2$; (iv) forming vias and/or trenches by a damascene or dual damascene method; (v) depositing a diffusion barrier layer 101 (such as a layer of TaN) by sputtering; (vi) depositing a copper seed layer by sputtering (not shown); and (vii) electroplating to fill the structure with copper (not shown), forming a copper interconnect recessed within the dielectric layer 102. Alternatively, a much thinner diffusion barrier layer 201 may be formed by ALD instead of sputtering (FIG. 2, wherein like reference numerals are used as in FIG. 1 except incremented by 100). The same process sequence is repeated to form many interconnect layers to complete interconnection of a semiconductor device.

Figure 3:
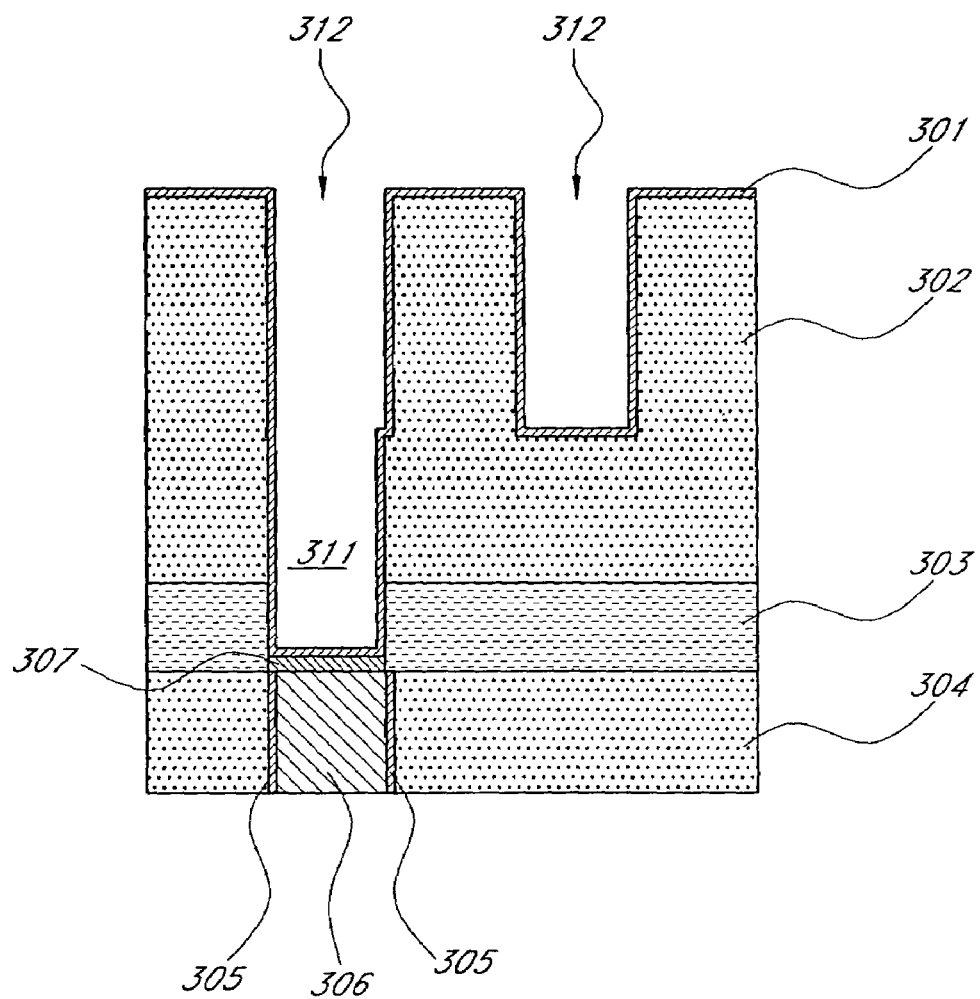
FIG. 3 is a schematic view of a dual damascene structure comprising a reliability enhancing layer selectively formed over a via bottom, according to a preferred embodiment of the invention.

With reference to FIG. 3, a dual damascene structure comprising buried damascene or copper lines 306 (one shown) at the bottom of vias 311 (one shown), a copper diffusion barrier 305 (e.g., metal nitride), a lower ILD layer 304 within which the copper lines 306 are recessed or inlaid, a dielectric diffusion barrier 303 and an upper ILD layer 302 is shown. The vias 311 extend downwardly from the floor of trenches 312 for making contact to lower levels. The dual damascene structure further comprises reliability enhancing layers 307 (one shown) selectively formed on top of the lower copper line 306 and comprising a layer of a noble metal, such as Pt, Au, Ru, Rh, Ir or Pd. A typical process sequence comprises: (i) chemical mechanical polishing (CMP) of a preexisting metal structure 306, a diffusion barrier 305 and a lower ILD layer 304 at a lower level to get a flat surface; (ii) depositing a dielectric diffusion barrier layer 303; (iii) depositing the ILD layer 302;

(iv) forming vias by a damascene or dual damascene method; (v) selectively forming reliability enhancing layers 307 at the via bottom on top of the lower copper line 306 using vapor deposition techniques described below, such as copper replacement reaction, CVD or ALD; (vi) depositing a diffusion barrier layer 301 by ALD or sputtering; (vii) depositing a copper seed layer by sputtering (not shown); and (viii) electroplating to fill the structure with copper (not shown), forming copper interconnects. The same process sequence may be repeated to form multiple interconnect layers to complete interconnection of a semiconductor device. A pretreatment step may be added before (v) selective reliability enhancing layers in order to reduce any copper oxide that may exist on top of lower copper line 306. Other copper filling techniques may be used at (vii) and (viii) steps instead of conventional sputtered copper seed and electroplated copper. For example, ALD of a thin Ru layer followed by CVD copper fill is contemplated as one method to fill very narrow vias/trenches.

During the CVD or ALD of noble metal, the actual deposition is delayed due to slow nucleation of noble metal atoms on dielectric surfaces. The time delay is called an incubation time. CVD or ALD of noble metal on a metal surface shows much shorter or zero incubation time. Thus, noble metal is selectively deposited on top of the lower copper line 306 if CVD or ALD is performed for a duration shorter than the incubation time of the noble metal deposition on any of the ILD layers 302 and 304, and dielectric diffusion barrier layer 303. Slight loss of selectivity, i.e., minute amounts of noble metal deposited on dielectric surface, has little impact on interconnect performance. Minute amounts of noble metal deposited on the walls of the vias and/or trenches are covered by the subsequent conductive diffusion barrier layer 301 and have the slightest impact on the conductivity of the metal interconnects. Minute amounts of noble metal deposited on the top, flat surface of the ILD layer 302 can be removed during a CMP step to removed excess copper and the diffusion barrier layer 301, With reference to FIG. 4, in another preferred embodiment of the invention, reliability enhancing layers 310 (one shown) are formed at the bottom of vias 313 (one shown) using a metal replacement reaction, described in more detail below. In the illustrated dual damascene context, the vias 313 extend downwardly from the floor trenches 314 for making contact to lower levels, although in single damascene contexts the vias might extend directly from upper field regions of the ILD. The reliability enhancing layers 310 comprise a layer of a noble metal, such as Pt, Au, Ru, Rh, Ir or Pd. The reliability enhancing layers 310 are only as thick as several (less than about 10) atomic layers because noble metal atoms replace copper atoms and the replacement reaction stops when there is no more copper exposed or accessible to the vapor phase noble metal precursor. In the illustrated embodiment, the reliability enhancing layers 310 are recessed within copper lines 306 (one shown). Further ALD or CVD of noble metal (not shown) may be performed following the replacement reaction to increase thickness of the reliability enhancing layers 310. The selectivity of ALD or CVD can be enhanced in this way because the selectivity of the replacement reaction is perfect and subsequent deposition by ALD or CVD starts immediately on the noble metal surfaces comprising the reliability enhancing layers 310 with no incubation time, thus allowing a larger process window. Depending on the nature of the replacement reaction, the thickness of reliability enhancing layer may be larger or smaller than the thickness of the replaced copper layer. If the number ratio of replacing noble metal atom and replaced copper atom is 1:1, the thickness hardly changes and the top level of the reliability enhancing layer is substantially the same as the top level of the lower copper line 306 before the replacement reaction. Even when the number ratio is not 1:1 the change of top level is not significant because the thickness of reliability enhancing layer formed by replacement reaction (typically less than 10 atomic layers) as well as the thickness of replaced copper layer are both about 2 nanometers (nm) or less. In comparison, the reliability enhancing layer protrudes substantially above the lower ILD layer 304 if additional ALD or CVD is performed in order to increase the thickness of reliability enhancing layer. In such a case, the reliability enhancing layer 310 may be surrounded by the overlying dielectric diffusion barrier 303, if present, or by the overlying ILD 302.

Figure 4:
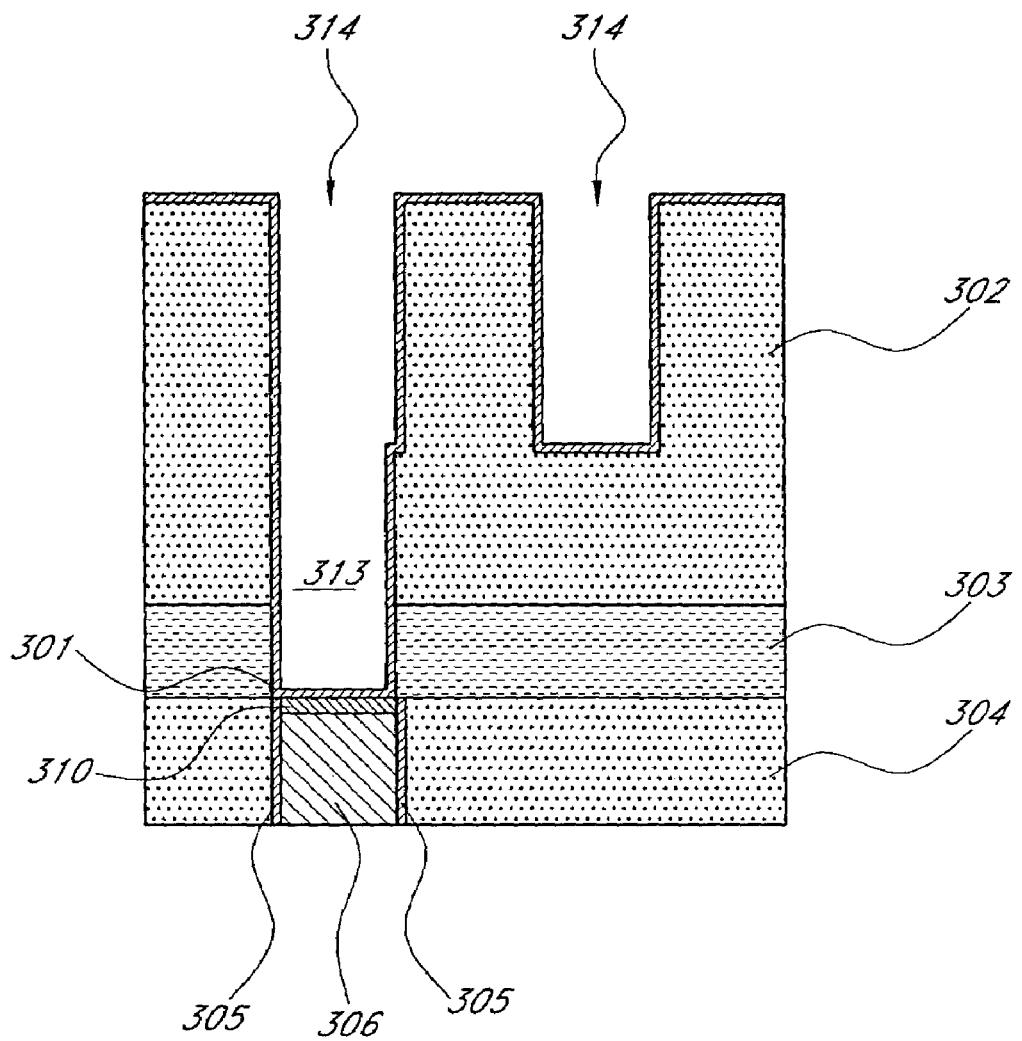
FIG. 4 is a schematic view of a dual damascene structure, comprising a reliability enhancing layer selectively formed at a via bottom, wherein the reliability enhancing layer is recessed within an underlying metal feature, such as a copper line, according to a preferred embodiment of the invention.
Figure 5:
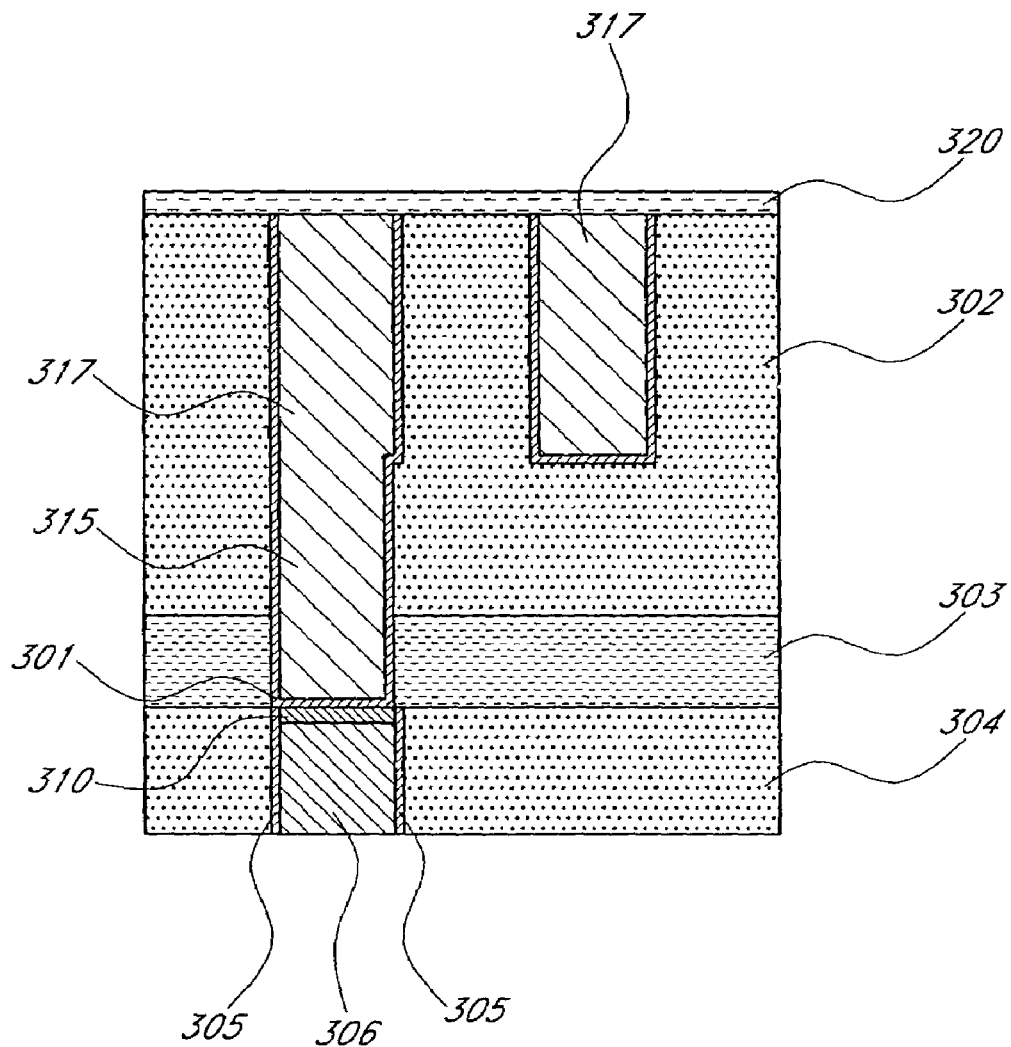
FIG. 5 is a schematic view of the dual damascene structure of FIG. 4 after filling the vias (one shown) and trenches with metal, such as copper, and forming a dielectric diffusion barrier layer over the structures, according to a preferred embodiment of the invention.

With reference to FIG. 5, the vias 313 and overlying trenches 314 of FIG. 4 are filled with a metal, such as copper, to form contacts or interconnects 315 and metal lines 317 that are recessed or inlaid within the upper ILD layer 302. A dielectric diffusion barrier layer 320 is then formed over the metal lines 317. A planarization step using, e.g., chemical mechanical polishing (CMP), precedes the step of forming the dielectric diffusion barrier layer 320.

Figure 2:
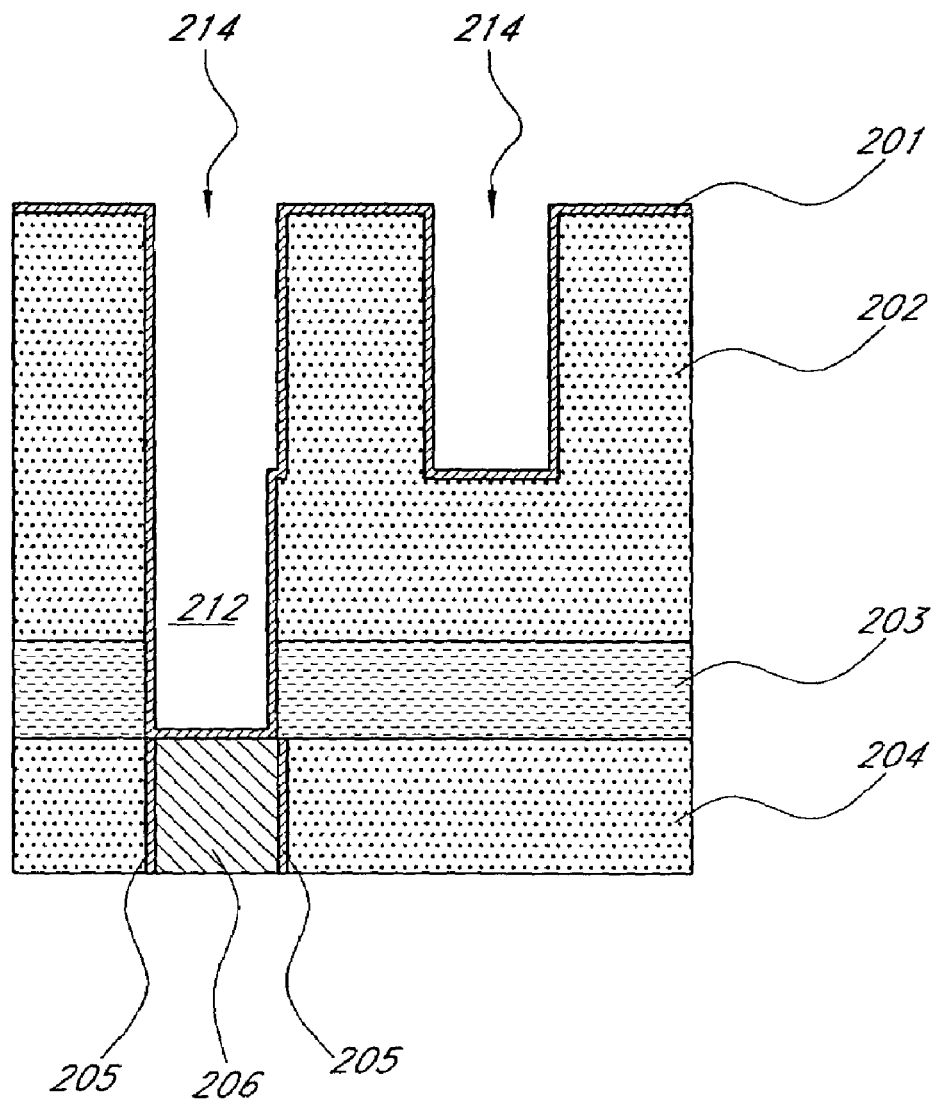
FIG. 2 is a schematic view of a dual damascene structure after depositing a diffusion barrier layer by ALD, in accordance with the prior art.
Figure 6:
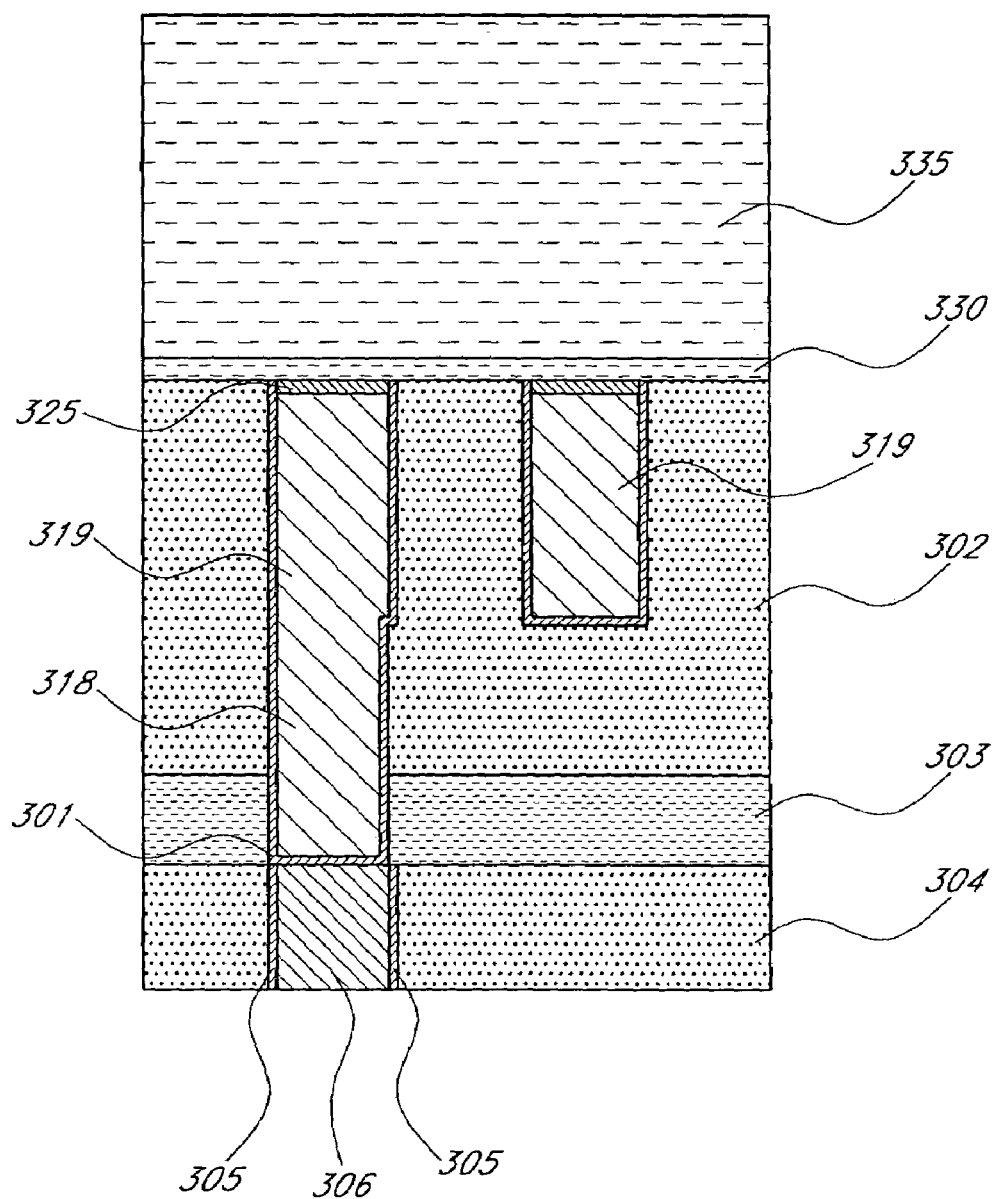
FIG. 6 is a schematic view of the dual damascene structure of FIG. 2 after the via and trenches with metal, such as copper, selectively forming a reliability enhancing layer over the copper by replacement reaction, forming a dielectric diffusion barrier layer over the structure, and forming an interlayer dielectric (ILD) layer over the dielectric diffusion barrier, according to a preferred embodiment of the invention.
Figure 7:
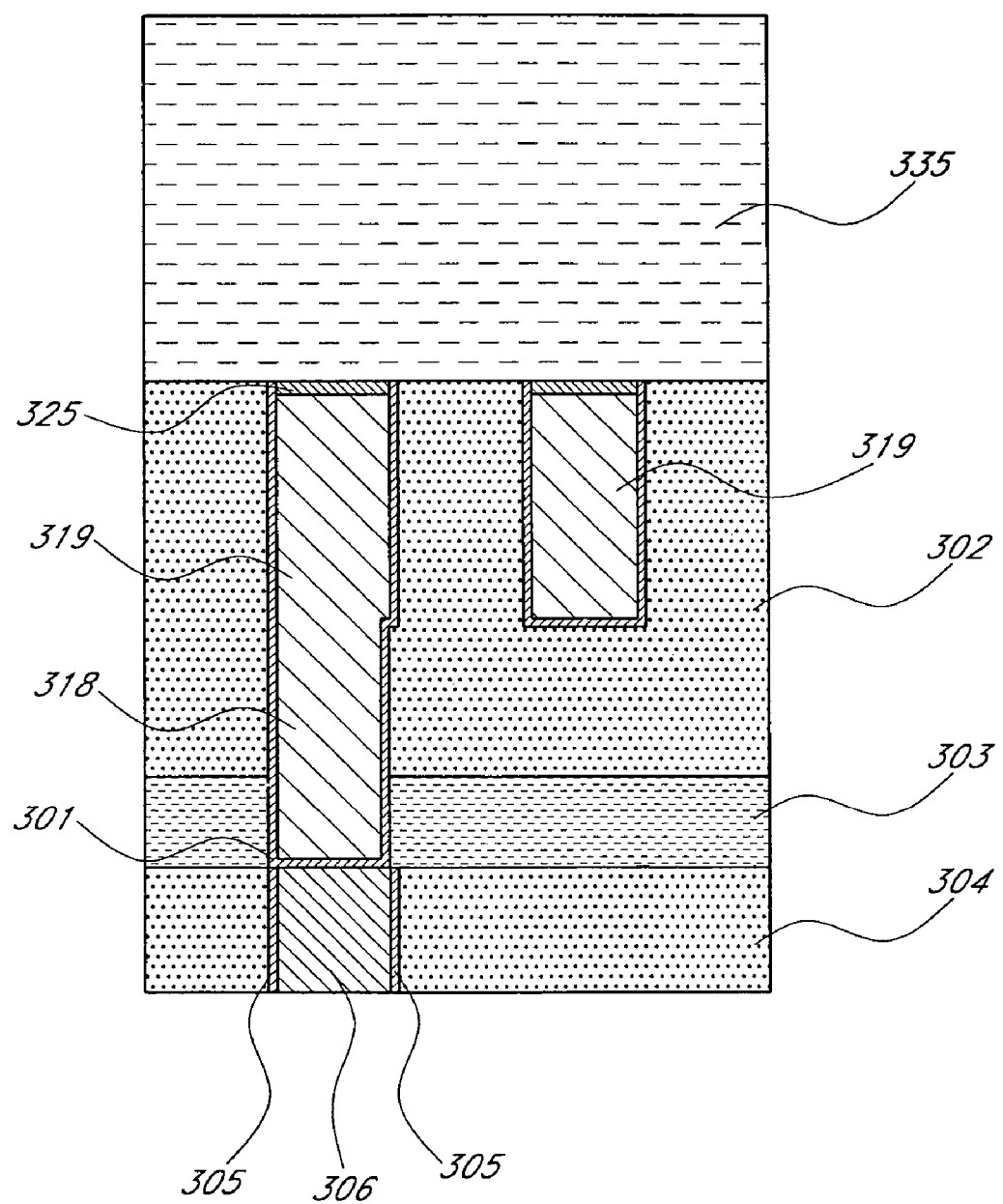
FIG. 7 is a schematic view of the dual damascene structure of FIG. 2 after filling the vias (one shown) and trenches with metal, such as copper, selectively forming a reliability enhancing layer over the metal by replacement reaction, and forming an interlayer dielectric (ILD) layer over the structure, according to a preferred embodiment of the invention.

With reference to FIG. 6, in another preferred embodiment of the invention, vias 212 (one shown) and trenches 214 of FIG. 2 are filled with metal (e.g., copper) to form contacts 318 (one shown) and metal lines 319 that are recessed or inlaid within the upper ILD layer 302. A planarization step using, e.g., CMP, follows the filling of the vias 212 and trenches 214. Following CMP, capping or reliability enhancing layers 325 are selectively formed on the top surfaces of the copper lines 319 using a metal replacement reaction, described below. The reliability enhancing layers 325 are recessed within the ILD layer 302. The reliability enhancing layers 325 comprise conductive layers of a noble metal, such as Pt, Au, Ru, Rh, Ir, or Pd. The top surfaces of the reliability enhancing layers 325 are recessed within and substantially coplanar with the top surfaces of the ILD layer 302 in which the copper lines 319 are recessed. The reliability enhancing layers 325 are only as thick as several atomic layers because noble metal atoms replace copper atoms and the replacement reaction stops when there is no more copper exposed or accessible to the noble metal precursor. Further ALD or CVD of noble metal (not shown) may be performed following the replacement reaction to increase thickness of the reliability enhancing layers 325. The selectivity of ALD or CVD can be enhanced in this way because the selectivity of replacement reaction is perfect and subsequent deposition by ALD or CVD starts immediately on the noble metal surfaces comprising the reliability enhancing layers 325 with no incubation time, thus allowing a larger process window. The reliability enhancing layers may protrude above the ILD layer 302 if additional selective ALD or CVD is performed in order to increase thicknesses of the reliability enhancing layers 325. Over the reliability enhancing layers 325, a dielectric diffusion barrier layer 330 and an other ILD layer 335 is formed sequentially. If the reliability enhancing layers 325 protrude above the ILD layer 302, the protruding portion of the reliability enhancing layers 325 may be surrounded by and partially recessed within the diffusion barrier layer 330, if present. The dielectric diffusion barrier layer 330 may be omitted because the top surfaces of the copper lines 319 are covered by the reliability enhancing layers 325, which prevent diffusion and migration of copper atoms (FIG. 7). In such a case, if the reliability enhancing layers 325 protrude above the ILD layer 302, the reliability enhancing layers 325 may be surrounded by and partially recessed within the overlying ILD 335. A layer still may be employed in place of the dielectric diffusion barrier layer 330 if it has other functions, such as an etch-stop layer.

Figure 8:
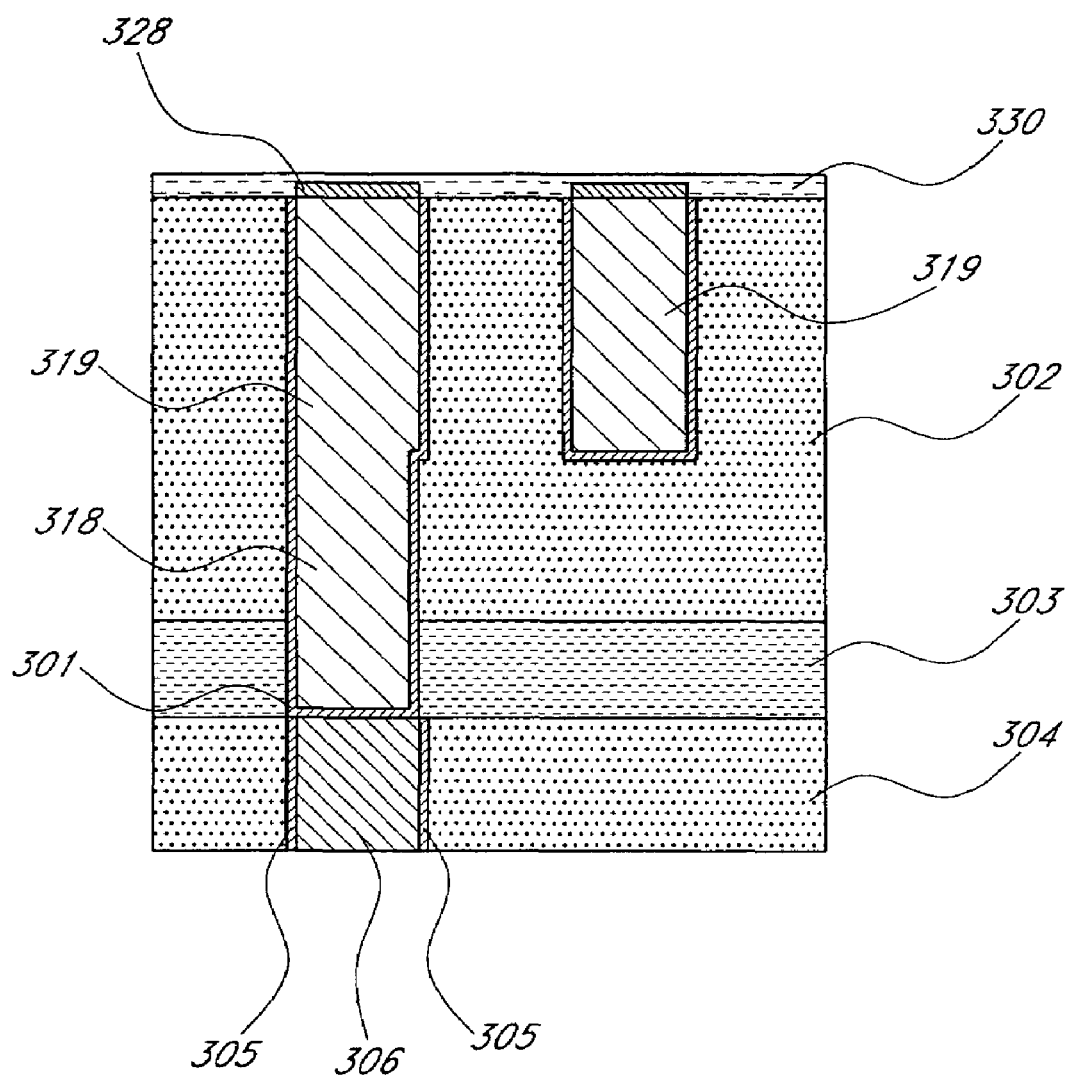
FIG. 8 is a schematic view of the dual damascene structure of FIG. 2 after filling the vias (one shown) and trenches with metal, such as copper, selectively depositing a reliability enhancing layer over the metal, and forming a dielectric diffusion barrier layer over the structure, according to a preferred embodiment of the invention.

With reference to FIG. 8, in another preferred embodiment of the invention, reliability enhancing layers 328 are selectively formed on the top surfaces of the polished and isolated copper lines 319 using a deposition process, such as CVD or ALD. The copper lines 319 are metal features recessed or inlaid within the upper ILD layer 302. During the CVD or ALD of noble metal, the actual deposition is delayed due to slow nucleation of noble metal precursors on dielectric surfaces. The time delay is called an incubation time. CVD or ALD of noble metals on metal surfaces show much shorter or zero incubation times. Thus, noble metal is selectively deposited on top of the lower copper line 306 if CVD or ALD is performed for a duration shorter than the incubation time of noble metal deposition on an ILD layer 302 or a CMP stop layer (not shown). In some preferred embodiments, the dielectric diffusion barrier layer 330 is formed over the reliability enhancing layers 328 and ILD layer 302, especially if it has another function such as an etch-stop layer. In the illustrated embodiment, the reliability enhancing layers 328 protrude above the ILD layer 302 or above a CMP stop layer (not shown), and are surrounded by the overlying dielectric diffusion barrier layer 330, if present, or by an overlying ILD layer (note shown). The bottom surfaces of the reliability enhancing layers 328 are substantially coplanar with the top surface of the ILD layer 302 (or of a CMP stop layer, not shown) in which the copper lines 319 are recessed. For purposes of the present description, any CMP stop layer will be considered part of the ILD layer. In some embodiments, an additional ILD layer (not shown) is formed over the dielectric diffusion barrier layer 330. In other embodiments (not shown), the other ILD layer is formed directly over the reliability enhancing layers 328 and ILD layer 302 without an intervening dielectric diffusion barrier.

In some embodiments (not shown), an ALD glue/seed layer may be deposited on top of barrier layer 301, and the vias and/or trenches are subsequently filled with copper by electroplating and/or CVD to form the copper lines and contacts of FIGS. 5-7, as described in WO PCT/KR02/02468 and published as WO 03/056612 and U.S. patent application No. 2005/0124154.

In an alternative embodiment, in addition to the reliability enhancing layers 325 (FIGS. 6 and 7) and 328 (FIG. 8) formed at the top of the copper lines 319, the dual damascene structures of FIGS. 6, 7 and 8 comprise reliability enhancing layers (not shown) formed at the bottoms of the vias 212, similar to the reliability enhancing layers 307 and 310 of FIGS. 3, 4 and 5, respectively, using either CVD, ALD, or a metal replacement reaction.

Advantages of the foregoing embodiments include, but are not limited to, increasing the reliability of a semiconductor device comprising copper (Cu) lines and contacts, inhibiting electromigration and/or stress-induced migration of Cu in vias and trenches, and inhibiting copper contact failure.

The methods for selectively forming noble metal layers on the metal features or lines 306, 317 and 319 using vapor phase reactants are described in more detail below.

Selective Atomic Layer Deposition

In other embodiments, reliability enhancing layers, such as reliability enhancing layers 307 (FIG. 3) and 328 (FIG. 7), are selectively formed using ALD. Reliability enhancing layers formed by ALD preferably comprise high melting point metals, more preferably noble metals, most preferably noble metals selected from the group of Pt, Au, Ru, Rh, Ir and Pd. Formation of noble metals layers using an ALD type process is described in U.S. patent application Ser. No. 60/662,144 to Huotari et al., filed Mar. 15, 2005, incorporated herein by reference. In an ALD type process, a substrate comprising a first surface and a second surface, which differ in material composition and properties, is contacted with a vapor phase compound of a noble metal (noble metal precursor). The first surface is preferably susceptible to an ALD type process to form the desired noble metal layer while the second surface is substantially insensitive to the same ALD process. As a result, the noble metal is selectively deposited on the first surface relative to the second surface. In the illustrated embodiments, the first surface is a metallization feature, particularly copper, while the second surface is an insulator in which the metal feature is recessed or buried.

At temperatures less than 450° C., noble metals are readily deposited by ALD on metals and metal nitrides. However, they are not readily deposited on lower k materials, such as silicon oxides (including C- and F-doped low k materials) and silicon nitrides. Thus, in particular embodiments, a noble metal film is selectively deposited on a first surface comprising a metal, such as, e.g., copper (Cu), while avoiding deposition on a second surface comprising a lower k material, such as a silicon oxide, silicon nitride, silicon oxynitride, fluorinated silica glass (FSG), carbon doped silicon oxide (SiOC) or material containing more than 50% of silicon oxide. Selective ALD can occur on a partly oxidized copper surface, such as a native oxide of copper, if the copper oxide layer is as thick as several atomic layers or less. In other embodiments, the reliability enhancing layer is selectively formed on a first surface comprising a metal while avoiding deposition on a second surface comprising an insulating material.

ALD type processes are based on controlled, self-limiting surface reactions of the precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses. This may be accomplished with an evacuation step using a vacuum and/or an inactive gas pulse or purge.

Briefly, the substrate comprising the first surface and the second surface is loaded in a reaction chamber and is heated to a suitable deposition temperature, generally at lowered pressure. Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved. Here, the temperature is also maintained low enough to ensure the selectivity of the deposition process. Preferably, the temperature is below about 450° C., more preferably below about 350° C., as discussed in more detail below.

A first reactant is conducted into the chamber in the form of gas phase pulse and contacted with the first and second surfaces on a partially fabricated substrate. Conditions are selected such that no more than about one monolayer (ML) of the precursor is adsorbed on the substrate surface in a self-limiting manner. Excess first reactant and reaction byproducts, if any, are purged from the reaction chamber, often with a pulse of inert gas, such as nitrogen or argon, and/or by use of a vacuum.

A second gaseous reactant is pulsed into the chamber where it reacts with the first reactant bound to the surface. Excess second reactant and vapor phase by-products of the surface reaction are purged out of the reaction chamber, preferably with the aid of an inert gas and/or vacuum. The steps of pulsing (supplying) and purging are repeated until a layer of the desired thickness has been selectively formed on the substrate, with each cycle leaving no more than a monolayer.

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size, "steric hindrance" restraints, and/or repulsive interactions) and thus excellent step coverage.

According to a preferred embodiment, a reliability enhancing layer (noble metal layer) is selectively deposited on a first surface relative to a second surface by an ALD type process comprising multiple pulsing cycles, each cycle comprising:

pulsing a vapor phase compound of a noble metal compound (noble metal precursor) into the reaction chamber to form a layer of the noble metal precursor on the first surface of the substrate; purging the reaction chamber to remove excess noble metal precursor and reaction by products, if any;

providing a pulse of a second reactant, such as an oxygen, ozone, ammonia or ammonia plasma containing gas onto the first and second surfaces;

purging the reaction chamber to remove excess second reactant and any gaseous by-products formed in the reaction between the noble metal precursor layer on the first surface of the substrate and the second reactant; and repeating the pulsing and purging steps until a noble metal layer of desired thickness has been formed.

Suitable noble metal precursors may be selected by the skilled artisan. In general, metal compounds where the metal is bound or coordinated to oxygen, nitrogen, carbon or a combination thereof are preferred. More preferably metallocene compounds, beta-diketonate compounds and acetamidinato compounds are used. In some embodiments a cyclopentadienyl precursor compound is used, preferably a bis (ethylcyclopentadienyl) compound.

When depositing ruthenium thin films, preferred metal precursors may be selected from the group of bis(cyclopentadienyl)ruthenium, tris(2,2,6,6-tetramethyl-3, 5-heptanedionato)ruthenium and tris(N,N'-diisopropylacetamidinato)ruthenium(III) and their derivatives, such as bis(N,N'-diisopropylacetamidinato)ruthenium(II) dicarbonyl, bis (ethylcyclopentadienyl)ruthenium, bis (pentamethylcyclopentadienyl)ruthenium and bis(2,2,6,6-tetramethyl-3,5-heptanedionato)(1,5-cyclooctadiene) ruthenium(II). In preferred embodiments, the precursor is bis(ethylcyclopentadienyl) ruthenium ($Ru(EtCp)_2$).

When depositing platinum films, preferred metal precursors include (trimethyl)methylcyclopentadienylplatinum (IV), platinum (II) acetylacetonato, bis(2,2,6,6-tetramethyl-3,5-heptanedionato)platinum(II) and their derivatives.

As mentioned above, the noble metal ALD process typically comprises alternating pulses of noble metal precursor and an oxygen-containing reactant. The oxygen-containing reactant pulse may be provided, for example, by pulsing (supplying) diatomic oxygen gas or a mixture of oxygen and another gas into the reaction chamber. In one embodiment, ammonia plasma or ammonia is used as a second reactant. In other embodiments, oxygen is formed inside the reactor, such as by decomposing oxygen containing chemicals. Oxygen containing chemicals that can be decomposed in the reactor to produce oxygen include, without limitation, $H_2O_2$, $N_2O$ and organic peroxides. Mixtures of such chemicals can also be used. In other embodiments, the catalytic formation of an oxygen containing pulse can be provided by introducing into the reactor a pulse of vaporized aqueous solution of $H_2O_2$ and conducting the pulse over a catalytic surface inside the reactor and thereafter into the reaction chamber. The catalytic surface is preferably a piece of platinum or palladium.

In preferred embodiments the oxygen-containing reagent comprises free-oxygen or ozone, more preferably molecular oxygen. The oxygen-containing reagent is preferably pure molecular diatomic oxygen, but can also be a mixture of oxygen and inactive gas, for example, nitrogen or argon.

The noble metal precursor employed in the ALD type processes may be solid, liquid or vapor phase material under standard conditions, provided that the noble metal precursor is in vapor phase before it is conducted into the reaction chamber and contacted with the substrate surface. "Pulsing" a vaporized precursor onto the substrate means that the precursor vapor is conducted into the chamber for a limited period of time. Typically, the pulsing time is from about 0.05 to 10 seconds. However, depending on the substrate type and its surface area, the pulsing time may be even higher than 10 seconds. Preferably, for a 300 mm wafer in a single wafer ALD reactor, the noble metal precursor is pulsed for from 0.05 to 10 seconds, more preferably for from 0.5 to 3 seconds and most preferably for about 0.5 to 1.0 seconds. The oxygen-containing precursor is preferably pulsed for from about 0.05 to 10 seconds, more preferably for from 1 to 5 seconds, most preferably about for from 2 to 3 seconds. Pulsing times can be on the order of minutes in some cases, particularly where high aspect ratio openings are on the substrate. The optimum pulsing time can be readily determined by the skilled artisan based on the particular circumstances.

The mass flow rate of the noble metal precursor can be determined by the skilled artisan. In one embodiment, for deposition on 300 mm wafers the flow rate of noble metal precursor is preferably between about 1 sccm and about 1000 sccm without limitation, more preferably between about 100 and 500 sccm. The mass flow rate of the noble metal precursor is usually lower than the mass flow rate of oxygen, which is usually between about 10 and 10000 sccm without limitation, more preferably between about 100-2000 sccm and most preferably between 100-1000 sccm.

Purging the reaction chamber means that vapor phase precursors and/or vapor phase byproducts formed in the reaction between the precursors are removed from the reaction chamber, such as by evacuating the chamber by use of a vacuum (using a vacuum pump or a plurality of pumps) and/or by replacing the gas inside the reactor with an inert gas, such as argon or nitrogen. Typical purging times are from about 0.05 to 20 seconds, more preferably between about 0.5 and 10 seconds, and still more preferably between about 0.5 and 2 seconds.

The pressure in the reaction space is typically between about 0.01 and 20 mbar, more preferably between about 1 and 10 mbar.

Before starting the deposition of the film, the substrate is typically heated to a suitable growth temperature. Preferably, the growth temperature of the metal thin film is below 450° C., more preferably between about 150° C. and about 400° C. The preferred deposition temperature may vary depending on a number of factors such as, and without limitation, the reactant precursors, the pressure, flow rate, the arrangement of the reactor, and the composition of the substrate including the nature of the material to be deposited on and the nature of the material on which deposition is to be avoided. The specific growth temperature may be selected by the skilled artisan using routine experimentation to maximize the selectivity of the process.

The processing time depends on the thickness of the layer to be produced and the growth rate of the film. In ALD, the growth rate of a thin film is determined as thickness increase per one cycle. One cycle consists of the pulsing and purging steps of the precursors and the duration of one cycle is typically between about 0.2 and 30 seconds, more preferably between about 0.5 and 10 seconds, but it can be on order of minutes or more in some cases.

Examples of suitable reactors that may be used for the deposition of thin films according to the processes of the present invention include commercially available ALD equipment such as the F-120® reactor, Pulsar® reactor and EmerALD™ reactor, available from ASM America, Inc of Phoenix, Ariz. In addition to these ALD reactors, many other kinds of reactors capable of ALD growth of thin films, including CVD reactors equipped with appropriate equipment and means for pulsing the precursors, can be employed for carrying out the processes of the present invention. Preferably, reactants are kept separate until reaching the reaction chamber, such that shared lines for the precursors are minimized. However, other arrangements are possible, such as the use of a pre-reaction chamber as described in U.S. application Ser. No. 10/929,348, filed Aug. 30, 2004 and 09/836,674, filed Apr. 16, 2001, incorporated herein by reference.

The growth processes can optionally be carried out in a reactor or reaction space connected to a cluster tool. In a cluster tool, because each reaction space is dedicated to one type of process, the temperature of the reaction space in each module can be kept constant, which clearly improves the throughput compared to a reactor in which the substrate is heated up to the process temperature before each run.

Selective Chemical Vapor Deposition

In a preferred embodiment of the invention, reliability enhancing layers, such as reliability enhancing layers 307 (FIG. 3) and 328 (FIG. 8), are selectively formed using chemical vapor deposition (CVD). Reliability enhancing layers formed by CVD preferably comprise high melting point metals, more preferably noble metals, most preferably noble metals selected from the group of Pt, Au, Ru, Rh, Ir and Pd. The selective formation of the reliability enhancing layers using CVD comprises contacting a substrate comprising a first surface and a second surface simultaneously with a vapor phase compound of a noble metal (noble metal precursor gas) and a reactant gas (see below). The first surface is preferably susceptible to a CVD type process to form the desired noble metal layer while the second surface is substantially insensitive to the same CVD process. Because the nucleation rate of the vapor phase compound is substantially higher on the first surface relative to the second surface, a layer of the noble is deposited on the first surface and not the second surface. For example, if the first surface is the top surface of a copper feature and the second surface is defined by a $SiO_2$-based dielectric layer, contacting the surfaces simultaneously with the noble metal precursor gas and reactant gas deposits the noble metal on the top surface of the exposed surfaces of copper features while avoiding deposition on the dielectric layer. As noted above, CVD of noble metals on metal surfaces show much shorter incubation times relative to deposition on dielectrics. Thus, noble metal is selectively deposited on the first surface if CVD is performed for a duration shorter than the incubation time of noble metal deposition on the second (typically dielectric) surface. Minute amounts of noble metal that may deposit on the surface of the dielectric layer, such as amounts that do not affect the conductivity of the copper feature and/or do not degrade the insulating qualities of the dielectric layer, are tolerable.

The noble metal precursors listed above for ALD can be used for CVD if both of the metal precursor and a reactive gas to aid in releasing noble metal from the precursor are supplied concurrently. A case of Ru layer is described more specifically below. For example, a ruthenium (Ru) reliability enhancing layer, such as reliability enhancing layer 307 (FIG. 3), is selectively formed over the surface of the buried copper line 306 exposed at the bottom of the vias 317 by contacting the dielectric and copper surfaces simultaneously with a Ru precursor gas and reactant gas. The reactant gas includes, but is not limited to, oxygen ($O_2$) and ammonia ($NH_3$). Ru nucleation using the precursors described below is extremely slow on dielectric material, such as $SiO_2$. For example, preferred CVD reactions include:

(1,3-cyclohexadiene)Ru(CO)$_3$+NH$_3$→Ru+by-products

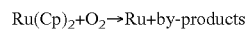
Ru(Cp)$_2$+O$_2$→Ru+by-products

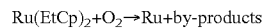
Ru(EtCp)$_2$+O$_2$→Ru+by-products

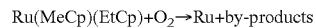
Ru(MeCp)(EtCp)+O$_2$→Ru+by-products

The CVD reactions are performed at a temperature below 450° C., more preferably between about 150° C. and about 400° C., for a duration of about 1 second to about 1000 seconds. The CVD reactions typically performed at a pressure between about 0.01 mbar and about 50 mbar, more preferably between about 1 mbar and about 10 mbar.

Before noble metal deposition, any copper oxide that may exist at the via bottom may be reduced using reactive cleaning gas, such as $NH_3$, $H_2$, hydrogen radicals or reducing organic molecules, such as alcohols (e.g., $C_2H_5OH$) and carboxylic acids (e.g., HCOOH), as described in U.S. Pat. No. 6,921,712. Before noble metal deposition, the substrate may be exposed to gas-discharge plasma of a cleaning or reducing gas, such as $NH_3$, $H_2$, a mixture of $H_2$ and $N_2$, or its mixture with a inert gas such as He or Ar. If oxygen is used in the selective formation of the reliability enhancing layer, the wafer may be subsequently treated with $NH_3$, $H_2$, hydrogen radicals, reducing organic molecules, such as $C_2H_5OH$, HCOOH or gas-discharge plasma mentioned above, in order to reduce an oxide of copper, which may be formed during the noble metal deposition. Selective CVD can occur on a partly oxidized copper surface, such as a native oxide of copper, if the copper oxide layer is as thick as several atomic layers or less.

In other embodiments, the noble metal precursor gas is supplied concurrently or intermittently with a metal etchant to enhance the selectivity of formation of the reliability enhancing layer. The reliability enhancing layer is selectively formed on, e.g., the top surface of a copper line or the copper exposed at the bottom of a via without formation on insulating surfaces.

Selective Replacement Reaction

In a preferred embodiment of the invention, reliability enhancing layers, such as reliability enhancing layers 310 (FIGS. 4 and 5) and 325 (FIGS. 6 and 7), are formed using a metal replacement reaction. The reliability enhancing layer is preferably formed of a high melting point metal, more preferably noble metal, most preferably noble metal selected from the group of Pt, Au, Ru, Rh, Ir and Pd. In the metal replacement reaction, a first surface, defined by a metal, preferably copper (Cu), and a second surface, defined by a dielectric, are contacted with a vapor phase compound of a noble metal (vapor phase compound). Metal atoms from the first surface are replaced by the noble metal atoms, thereby depositing a layer of the noble metal on the first surface relative to the second surface. This process is concurrent with the generation of a vapor phase compound of the metal (e.g., Cu) defining the first surface.

A Cu replacement reaction is a selective, self-limiting deposition of a noble metal from a reactive vapor phase compound of the noble metal exclusively on an exposed copper formed on a wafer (e.g., vias and/or trenches filled with copper), wherein the metal replaces Cu. The reaction proceeds until the copper atoms defining the surface are inaccessible to the vapor phase compound. There is no deposition of metal on a dielectric layer because the metal replacement reaction, ML (gas)+Cu (solid)→M (solid)+CuL (gas), wherein M represents a metal compound or compound of metals and L represents a ligand or a plurality of ligands, only occurs on the exposed copper surface. CuL is a vapor phase compound comprising the ligand (L) produced in the Cu replacement reaction. The replacement reaction proceeds by contacting the Cu surface with the vapor phase compound of the noble metal. As a result, the surface of the exposed Cu is replaced with M. This replacement reaction occurs when M has a higher standard electrode potential or is "more noble" than Cu. Thus, M does not tend to diffuse as readily as Cu, thereby inhibiting migration of Cu between Cu lines or along a surface of Cu lines. A layer of M functions as a Cu barrier layer in combination with a dielectric layer.

In a preferred embodiment, M is a noble metal selected from the group of Pt, Au, Ru, Rh, Ir and Pd. In other embodiments, other metals having a higher standard electrode potential than the metal to be replaced can be used. If M has a higher standard electrode potential than Cu, an oxidized form (metal ions) of M (more noble than Cu) can take electrons from Cu (less noble metal). For example, the standard electrode potential $E°$ of $Cu/Cu^+$, $Pt/Pt^{2+}$, and $Au/Au^+$ are as follows:

$Cu/Cu^+$: $E°$=+0.52 V $Pt/Pt^{2+}$: $E°$=+1.18 V $Au/Au^+$: $E°$=+1.69 V

If M has a lower standard electrode potential than Cu, the reaction tends to occur in the reverse direction.

L, which is a ligand or a plurality of ligands that are volatile (to be used in a CVD reactor), contains at least one ligand which forms a volatile Cu compound (to remove a by-product containing Cu as a volatile molecule from the surface), and may contain other neutral ligand(s) which can be removed as free molecules. For example, L includes, but is not limited to, beta-diketonate or amidinate ligands which have the generic chemical formula $R_3C$—$C(O)$—$CH$—$C(O)$—$CR_3$ or R—N—C(R)—N—R, wherein R may be an alkyl, hydrogen, or halogen. Examples include, but are not limited to, hexafluoroacetylacetonate (hfac): $F_3C$—$C(O)$—$CH$—$C(O)$—$CF_3$; acetylacetonate (acac): $H_3C$—$C(O)$—$CH$—$C(O)$—$CH_3$; and 2,2,6,6-tetramethyl-3,5-heptanedionate (tmhd): $(CH_3)_3C$—$C(O)$—$CH$—$C(O)$—$C(CH_3)_3$ (Sometimes "tmhd" is called "dpm") and N,N'-diisopropylacetamidinato: $(CH_3)_2CH$—$N$—$CR$—$N$—$CH(CH_3)_2$, where R can be for example, butyl or methyl group.

For example, preferred MLs and replacement reactions include:

1) Bis(2,2,6,6-tetramethyl-3,5-heptanedionato)(1,5-cyclooctadiene)ruthenium (II), [(tmhd)₂Ru(COD)]:

Cu+(tmhd)₂Ru(COD)→Cu(tmhd)₂↑+Ru+COD

2) Ruthenium (III) acetylacetonate, [Ru(acac)₃]:

3Cu+2Ru(acac)₃→3Cu(acac)₂↑+2Ru

3) Tris(2,2,6,6-tetramethyl-3,5-heptanedionato)ruthenium (III), [Ru(tmhd)₃]:

3Cu+2Ru(tmhd)₃→3Cu(tmhd)₂↑+2Ru 4) tris(N,N'-diisopropylacetamidinato)ruthenium(III), [Ru(ⁱPr-amd)₃]:

3Cu+2Ru(ⁱPr-amd)₃→3Cu(ⁱPr-amd)₂↑+2Ru 5) bis(N,N'-diisopropylacetamidinato)ruthenium(II) dicarbonyl, [Ru(ⁱPr-amd)₂(CO)₂]:

Cu+Ru(ⁱPr-amd)₂(CO)₂→Cu(ⁱPr-amd)₂(CO)₂↑+Ru 6) 1,5-Cyclooctadiene(acetylacetonato)iridium (I), [(acac)Ir(COD)]:

Cu+2(acac)Ir(COD)→Cu(acac)₂↑+2Ir+2COD

7) Dicarbonyl(acetylacetonato)iridium (I), [(acac)Ir(CO)₂]:

Cu+2(acac)Ir(CO)₂→Cu(acac)₂↑+2Ir+2CO

8) Iridium (III) acetylacetonate, [Ir(acac)₃]:

3Cu+2Ir(acac)₃→3Cu(acac)₂↑+2Ir

9) Platinum (II) hexafluoroacetylacetonate, [Pt(hfac)2]:

Cu+Pt(hfac)₂→Cu(hfac)₂↑+Pt

10) Palladium (II) hexafluoroacetylacetonate, [Pd(hfac)2]:

Cu+Pd(hfac)₂→Cu(hfac)₂↑+Pd 11) (Acetylacetonato)bis(cyclooctene)rhodium (I), [(acac)Rh(cyclooctene)]:

Cu+2(acac)Rh(cyclooctene)₂→Cu(acac)₂↑+2Rh+4cyclooctene 12) (Acetylacetonato)bis(ethylene)rhodium (I), [(acac)Rh(CH₂═CH₂)₂]:

Cu+2(acac)Rh(CH₂═CH₂)₂→Cu(acac)₂↑+2Rh+4CH₂═CH₂

13) Acetylacetonato(1,5-cyclooctadiene)rhodium (I), [(acac)Rh(COD)]:

Cu+2(acac)Rh(COD)→Cu(acac)2↑+2Rh+2COD

14) Rhodium (III) acetylacetonate, [Rh(acac)₃]:

3Cu+2Rh(acac)₃→3Cu(acac)₂↑+2Rh

A representative process employing the copper replacement reaction ("replacement process") for selectively forming a reliability enhancing layer (copper capping layer) on an exposed surface of a copper interconnect, such as the reliability enhancing layer 325 shown in FIG. 6, will be described. The process described below can also be applied to selectively forming the reliability enhancing layer on a metal line at the bottom of a trench or via, such as the reliability enhancing layer 310 at the bottom of the trench of the dual damascene structure of FIG. 4. The replacement process includes, but is not limited to, the following preferred embodiments:

In one embodiment of the invention, a Cu replacement process is implemented on a chemical vapor deposition (CVD) reactor (e.g., cold wall, warm wall, or hot wall type), including a plasma CVD reactor and a thermal CVD reactor. Any CVD reactor can be used without structural modifications. The CVD reactor may be a single wafer type or a batch type, capable of handling many wafers.

A CVD system can be based on a normal CVD setup, which comprises gas inlets, a vacuum chamber, a wafer pedestal, a pressure controller and a pump to provide controlled pressures and atmospheres (below or above atmospheric pressure). Such a system can have and use normal options applicable to surface treatment, such as out-gassing, radical exposures and/or plasmas to remove contaminants and copper oxide (CuO), which is desirable prior to the copper replacement reaction. The replacement reaction can occur on a partly oxidized copper surface, such as native oxide of copper, if the copper oxide layer is only several atomic layers thick.

In a damascene scheme, a dielectric layer was deposited on a wafer and then etched to form vias and/or trenches where a Cu interconnect is formed. Usually a layer with excess Cu is deposited over the vias and/or trenches, such as by electrochemical deposition (ECD). The excess or overburden Cu layer is removed usually by chemical mechanical polishing (CMP), and then a layer of Cu interconnect is finished and the top surface of Cu interconnect is exposed. A wafer comprising the exposed copper interconnect is placed on a support in a vacuum chamber, preferably on a heated pedestal.

In a preferred embodiment, after a wafer is placed on the wafer pedestal (in a single wafer processing example), the chamber is closed and filled with a given gas mixture either inert or reactive at a given pressure (e.g., from about 10-6 to about 5 bar, preferably in the range of about 0.01 mbar to about 20 mbar). The wafer temperature is set from about room temperature to about 450° C., preferably from room temperature to about 400° C. including 200° C., 300° C., and ranges between any two numbers of the foregoing. The temperature can be selected based on the following criteria: 1) Both metal compounds (a noble metal precursor compound and a copper byproduct compound) are volatile at reaction temperature, 2) the temperature is high enough in order for reasonably fast reaction (all Cu atoms exposed on the surface may be replaced within a half hour to be practical), and 3) the temperature is suitable for back-end-of-line (BEOL) metallization application for semiconductor device manufacturing such as a temperature less than 400° C.

After the aforesaid pre-treatment or other pre-treatment to prepare a surface for copper replacement reaction or without such pre-treatment, Cu replacement reaction begins at the abovementioned temperature.

For a copper replacement reaction, the reactor chamber may be adjusted to the pressures in the ranges of from about $10^{-6}$ bar to about 5 bar, preferably in the range of about 0.01 mbar to about 20 mbar. The pressure can be such that precursors of low vapor pressure (i.e., vapor phase compound of a noble metal ) can be supplied. A gas mixture set to flow to the process chamber may include only reacting chemicals, comprised of metal and reactive ligands (e.g., $Ru(acac)_3$), or a mixture of the reacting chemicals and a carrier gas, which can be either an inert gas or a mixture of inert gases, as desired.

The flow of reactive chemicals can vary from about $10^{-3}$ standard cubic cm per minute (sccm) to tens of standard liters per minute (slm), preferably in the range from about 1 sccm to about 5 slm including 10, 50, 100, 250, 500, 1000, 2500 sccm, and ranges between any two numbers of the foregoing. The flow can be applied either continuously or intermittently while the chamber is either continually or intermittently pumped.

An inert gas can be used separately from the reactive chemicals or together with the reactive chemicals in vacuum processes. The inert gas includes, but is not limited to, Ar, $N_2$, He, or a mixture thereof (preferably, Ar or $N_2$). Any inert gas, which can fill a CVD chamber (e.g., in the range of about 0.5 slm to about 5 slm), purge a CVD chamber (e.g., in the range of about 0.5 slm to about 5 slm), or transport less volatile precursors with it (e.g., in the range of about 0.5 slm to about 5 slm), can be used. The inert gas is not involved in the replacement reaction. If the inert gas is mixed with the reactive chemicals, the flow ratio of reactive chemicals to inert gas may be in the range of 1:100,000 to 10:1, preferably 1:100 to 1:1.

A reactive cleaning or reducing gas for cleaning the metal surface before or during reliability enhancing layer formation includes, but is not limited to, $NH_3$, $H_2$, hydrogen radicals and reducing organic molecules, such as alcohols (e.g., $C_2H_5OH$) and carboxylic acids (e.g., HCOOH). Any reactive cleaning gas capable of reducing copper oxide formed on the top surface of Cu (if the copper surface has been exposed to air or an oxygen-containing environment) can be used. A reactive gas ($NH_3$, $H_2$, hydrogen radicals or reducing organic molecules, such as $C_2H_5OH$ and HCOOH) can be supplied (e.g., in the range of about 0.5 slm to about 5 slm) before supplying vapor phase compounds (deposition precursors), such as a Ru precursor, to prepare a copper surface for substitute reaction by reducing copper oxide to copper. Alternatively, the reactive cleaning gas for oxide cleaning (reduction or etching, preferably reduction) may be supplied continuously with deposition precursors for selective formation by way of a Cu replacement process.

The wafer can also be exposed to appropriate chemicals in sequence with reactive/inert carrier gases in a cyclic fashion (in cycles on the order of milliseconds (ms) to several seconds, or the order of tens of ms to hundreds of ms) to aid removal of reaction by-products (e.g., volatile Cu compounds and free molecules that were bound to the metal as ligands) or make the wafer surface more reactive to the reaction. If reaction by-products are not removed from the surface, they will tend to cover the surface and interfere with the reaction. Removing the by-products will keep the surface as reactive as at the beginning of the process. In a preferred embodiment, the noble metal will cover the Cu surface as reaction progresses. A preferred method is, however, exposing the wafer continually to reactive chemicals with an inert carrier gas under a constant flow for removing reaction by-products from the vicinity of the wafer. A total preferred exposure time can vary from about 0.1 seconds to about 1800 seconds, preferably from about 1 second to about 300 seconds.

For an example, $Pd(hfac)_2$ was used for the replacement reaction. $Pd(hfac)_2$ was vaporized at a temperature between about 40° C. and about 80° C. and carrier by a $N_2$ gas flow between about 50 sccm and about 1000 sccm. A substrate is maintained at a temperature between about 80° C. and about 200° C. and exposed to the $Pd(hfac)_2$ vapor for 1-1800 seconds.

The replacement reaction may continue until it is complete, i.e., all the exposed copper which can react with reactive chemicals has reacted. The reaction is selective, self-limiting formation of a noble metal layer on the copper surface through exposure to a vapor phase compound of a noble metal. Eventually, the Cu surface will be covered completely by the noble metal, deposition precursors cannot reach Cu and the reaction will not occur anymore. That is an advantage of this method, i.e. covering or protecting the Cu surface with the noble (non-corroding) metal without excessive consumption of Cu. In a preferred embodiment, only the noble metal emerges on top of the Cu surface, and all other by-products are removed therefrom in order to keep the reaction progressing until all the Cu on the exposed surface is consumed and replaced by the noble metal.

The resulting noble metal layer is typically thicker than one atomic layer, which is the minimum amount that will cover Cu completely. The maximum thickness may be determined depending on temperature, nature of precursor and other conditions. Smaller or more diffusive precursors and higher temperatures will tend to lead to thicker noble metal layers for the replacement reaction.

In all of the aforesaid embodiments, any element used in an embodiment can interchangeably be used in another embodiment unless such a replacement is not feasible. Further, the present invention can equally be applied to apparatuses and methods.

It will be understood by those of skill in the art that numerous and various modifications can be made without departing from the spirit of the present invention. For example, the capping or reliability enhancing layers can be defined by compounds or alloys of identified noble metals. As another example, the reliability enhancing layers can be selectively formed on the upper surfaces of contacts and landing pads. Therefore, it should be clearly understood that the forms of the present invention are illustrative only and are not intended to limit the scope of the present invention. All modifications and changes are intended to fall within the scope of the invention, as defined by the appended claims.

We claim:

1. A method for selectively forming a conductive layer in an integrated circuit, comprising:
providing a copper-exposed surface as a first surface and a non-copper surface as a second surface; and
contacting the first surface and the second surface with a vapor phase compound of a noble metal for replacing copper on the first surface with the noble metal dissociated from the compound, thereby depositing the noble metal predominantly on the first surface relative to the second surface as a result of replacing copper on the first surface with the noble metal dissociated from the compound.

2. The method according to claim 1, wherein the second surface comprises an insulator in which copper is inlaid.

3. The method according to claim 2, wherein the insulator comprises a low k material.

4. The method according to claim 1, wherein the first surface comprises the bottom of a via and the second surface is defined by an insulator in which the via is formed.

5. The method of claim 4, wherein the via extends downwardly from a trench in a dual damascene structure.

6. The method according to claim 1, wherein the first surface comprises an upper surface of a copper line.

7. The method of claim 1, wherein the second surface is defined by an insulating material.

8. The method of claim 1, wherein the noble metal is selected from the group of Pt, Au, Ru, Rh, Ir and Pd.

9. The method of claim 1, wherein depositing the noble metal further comprises selectively depositing by atomic layer deposition (ALD) or chemical vapor deposition (CVD) additional noble metal onto the noble metal that is formed by replacing.

10. The method of claim 1, wherein the vapor phase compound of the noble metal is selected from the group of bis(2,2,6,6-tetramethyl-3,5-heptanedionato)(1,5-cyclooctadiene)ruthenium (II), ruthenium (III) acetylacetonate, tris(2,2,6,6-tetramethyl-3,5-heptanedionato)ruthenium (III), 1,5-cyclooctadiene(acetylacetonato)iridium (I) dicarbonyl(acetylacetonato)iridium (I), iridium (III) acetylacetonate, platinum (II) hexafluoroacetylacetonate, (acetylacetonato) bis(cyclooctene)rhodium (I), (acetylacetonato)bis(ethylene) rhodium (I), acetylacetonato(1,5-cyclooctadiene)rhodium (I), rhodium (III) acetylacetonate, palladium (II) hexafluoro-acetylacetonate, tris(N,N'-diisopropylacetamidinato)ruthenium(III) and bis(N,N'-diisopropylacetamidinato)ruthenium (II) dicarbonyl.

11. The method according to claim 1, further comprising forming a vapor phase compound of copper (Cu) by replacing the noble metal in the vapor phase with the copper as a result of replacing the copper on the first surface with the noble metal.

12. The method according to claim 11, wherein the vapor phase compound of copper and the vapor phase compound of the noble metal comprise at least one ligand.

13. The method according to claim 12, wherein the ligand comprises a neutral ligand which can be removed in free molecular form when dissociated from the compounds.

14. The method according to claim 13, wherein the neutral ligand comprises 1,5-cyclooctadiene.

15. The method according to claim 1, further comprising supplying a reactive cleaning gas for reducing copper oxide before contacting.

16. The method according to claim 1, wherein depositing the noble metal comprises depositing atoms of the noble metal on the first surface.

17. The method according to claim 16, wherein an incubation time of depositing atoms of the noble metal on the first surface is zero or much shorter than an incubation time of depositing atoms of the noble metal on the second surface.

18. The method according to claim 16, wherein a conductive layer of the noble metal is formed by chemical vapor deposition (CVD) by supplying a reactant gas with the vapor phase compound of the noble metal.

19. The method according to claim 18, wherein the conductive layer is formed at a temperature between about 150°C and about 400°C.

20. The method according to claim 18, wherein the conductive layer is formed at a pressure between about 1mbar and 10mbar.

21. The method according to claim 18, wherein the vapor phase compound of the noble metal is supplied for a duration of about 1 second to about 1000 seconds.

22. The method according to claim 18, wherein the reactant gas comprises oxygen ($O_2$) or ammonia ($NH_3$).

23. The method according to claim 18, wherein the vapor phase compound of the noble metal is selected from the group of(1,3-cyclohexadiene)Ru(CO)$_3$, Ru(Cp)$_2$, Ru(EtCp)$_2$ and Ru(MeCp)(EtCp).

24. The method according to claim 18, wherein the vapor phase compound of the noble metal comprises metallocene compounds.

25. The method of claim 16, wherein a conductive layer of the noble metal is formed by atomic layer deposition (ALD) by alternately supplying a reactant gas with the vapor phase compound of the noble metal.

26. The method of claim 25, wherein the conductive layer is formed at a pressure between about 1and 10mbar.

27. The method of claim 25, wherein the conductive layer is formed at a temperature between about 150°C and about 400°C.

28. The method according to claim 25, wherein the vapor phase noble metal compound comprises metallocene compounds.

29. The method according to claim 24, wherein the vapor phase noble metal compound comprises beta-diketonate compounds and acetamidinato compounds.

30. The method according to claim 25, wherein the reactant gas comprises oxygen ($O_2$), ozone ($O_3$), ammonia ($NH_3$) or ammonia plasma.

31. The method according to claim 25, wherein the vapor phase noble metal compound is selected from the group of bis(cyclopentadienyl)ruthenium, tris(2,2,6,6-tetramethyl-3,5-heptanedionato)ruthenium, tris(N,N'-diisopropylacetamidinato)ruthenium(III), bis(N,N'-diisopropylacetamidinato)ruthenium(II) dicarbonyl, bis(ethylcyclopentadienyl)ruthenium, bis(pentamethylcyclopentadienyl)ruthenium, bis(2,2,6,6-tetramethyl-3,5-heptanedionato)(1,5-cyclooctadiene)ruthenium(II), bis(ethylcyclopentadienyl)ruthenium (Ru(EtCp)$_2$), (trimethyl)methylcyclopentadienylplatinum(IV), platinum (II) acetylacetonato, bis(2,2,6,6-tetramethyl-3,5-heptanedionato)platinum(II) and their derivatives.

32. The method according to claim 1, further comprising forming a dielectric layer on top of the conductive layer.

33. A method for selectively forming a conductive layer in an integrated circuit, comprising:
   providing a copper-exposed surface as a first surface and a non-copper surface as a second surface, the first surface being defined by a metal feature of the integrated circuit, the metal feature comprising copper;
   contacting the first surface and the second surface with a vapor phase compound of a noble metal; and
   performing a replacement reaction, wherein the copper of the metal feature is replaced with the noble metal dissociated from the vapor phase compound of the noble metal, thereby depositing the noble metal predominantly on the first surface relative to the second surface.

34. The method according to claim 33, wherein the second surface is defined by an insulator in which the conductor is inlaid.

35. The method according to claim 33, wherein the first surface comprises the bottom of a via.

36. The method according to claim 33, wherein the metal feature comprises a conductive line and the first surface comprises an upper surface of the conductive line.

37. The method of claim 33, wherein the noble metal is selected from the group of Pt, Au, Ru, Rh, Ir and Pd and Ag.

38. The method of claim 33, wherein the vapor phase compound of the noble metal is selected from the group of bis(2,2,6,6-tetramethyl-3,5-heptanedionato)(1,5-cyclooctadiene)ruthenium (II), ruthenium (III) acetylacetonate, tris(2,2,6,6-tetramethyl-3,5-heptanedionato)ruthenium (III), 1,5-cyclooctadiene(acetylacetonato)iridium (I), dicarbonylacetylacetonato iridium (I), iridium (III) acetylacetonate, platinum (II) hexafluoroacetylacetonate, acetylacetonatobis(cyclooctene)rhodium (I), acetylacetonatobis(ethylene)rhodium (I), acetylacetonato(1,5-cyclooctadiene)rhodium (I), rhodium (III) acetylacetonate, palladium (II) hexafluoroacetylacetonate, tris(N,N'-diisopropylacetamidinato)ruthenium(III) and bis(N,N'-diisopropylacetamidinato)ruthenium (II) dicarbonyl.

39. The method according to claim 33, further comprising forming a vapor phase compound of copper by replacing the noble metal in the vapor phase with the copper as a result of replacing the copper on the first surface with the noble metal.

40. The method according to claim 39, further comprising removing by-products and other contaminants including the vapor phase compound of copper.

41. The method according to claim 33, wherein the replacement reaction is conducted at a temperature of about room temperature to about 400°C.

42. The method according to claim 33, wherein the vapor phase compound of the noble metal is supplied with an inert gas.

43. The method according to claim 33, further comprising supplying a reactive reducing gas to the first surface for reducing an oxide of the material of the first surface prior to contacting.

44. The method according to claim 43, wherein the reactive reducing gas is selected from the group of $NH_3$, $H_2$, hydrogen radicals, alcohols and carboxylic acids.

45. The method according to claims 33, further comprising selectively depositing additional noble metal by chemical vapor deposition (CVD) or atomic layer deposition (ALD) on the conductive layer comprising the noble metal.

* * * * *

UNITED STATES PATENT AND TRADEMARK OFFICE
CERTIFICATE OF CORRECTION

PATENT NO.        : 7,476,618 B2
APPLICATION NO.   : 11/254071
DATED             : January 13, 2009
INVENTOR(S)       : Kilpela et al.

It is certified that error appears in the above-identified patent and that said Letters Patent is hereby corrected as shown below:

At column 2, line 13, please change "forming" to --bottom--.

At column 2, line 19, please change "2004," to --2004.--.

At column 9, line 18 to 19, please delete "purging the reaction chamber to remove excess noble metal precursor and reaction by products, if any;" and insert therefore, --purging the reaction chamber to remove excess noble metal precursor and reaction by products, if any;--, beginning on Column 9, Line 19 as a new paragraph.

At column 17, line 59, after "(I)" in Claim 10, please insert therefore, --,--.

At column 18, line 38, please change "(0$_2$)" in Claim 22, to --(O$_2$)--.

At column 18, line 41, please change "Ru(EtCp)$_2$and" to --Ru(EtCp)$_2$ and.--.

At column 18, line 50, please change "1and" in Claim 26, to --1 and--.

Signed and Sealed this

Twenty-sixth Day of May, 2009

JOHN DOLL
*Acting Director of the United States Patent and Trademark Office*